United States Patent
Satoskar et al.

(10) Patent No.: US 9,959,856 B2
(45) Date of Patent: May 1, 2018

(54) SYSTEMS AND METHODS FOR REDUCING ARTIFACTS AND IMPROVING PERFORMANCE OF A MULTI-PATH ANALOG-TO-DIGITAL CONVERTER

(71) Applicant: Cirrus Logic International Semiconductor Ltd., Edinburgh (GB)

(72) Inventors: Aniruddha Satoskar, Austin, TX (US); Daniel J. Allen, Austin, TX (US); Edmund Mark Schneider, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days. days.

(21) Appl. No.: 14/739,289

(22) Filed: Jun. 15, 2015

(65) Prior Publication Data

US 2016/0365081 A1    Dec. 15, 2016

(51) Int. Cl.
*H04R 3/02* (2006.01)
*G10K 11/175* (2006.01)
*H03M 1/18* (2006.01)
*H04R 3/00* (2006.01)
*H03M 1/00* (2006.01)
*H03M 1/06* (2006.01)
(Continued)

(52) U.S. Cl.
CPC ........... *G10K 11/175* (2013.01); *H03M 1/002* (2013.01); *H03M 1/0631* (2013.01); *H03M 1/188* (2013.01); *H03M 3/466* (2013.01); *H04H 20/10* (2013.01); *H04R 3/00* (2013.01)

(58) Field of Classification Search
CPC ........... H04R 2227/005; H04R 25/356; H04R 27/00; H04R 3/002; H04R 2499/13; H04R 3/00; H04R 5/027; H04R 5/033; H04R 19/005; H04R 2201/003; H04R 2430/01; H04R 2460/03; H04R 29/006; H04R 3/06
USPC ..... 381/106, 107, 56, 71.1, 71.14, 104, 108, 381/61, 71.11, 71.12, 71.13, 94.1, 94.3, 381/73, 119, 109, 17, 18, 86, 73.1, 94.2
See application file for complete search history.

(56) References Cited

U.S. PATENT DOCUMENTS

| | | | |
|---|---|---|---|
| 4,346,349 | A | 8/1982 | Yokoyama |
| 4,441,081 | A | 4/1984 | Jenkins |
| 4,446,440 | A | 5/1984 | Bell |

(Continued)

FOREIGN PATENT DOCUMENTS

| | | | |
|---|---|---|---|
| EP | 0351788 | A2 | 7/1989 |
| EP | 0966105 | A2 | 12/1999 |

(Continued)

OTHER PUBLICATIONS

GB Patent Application No. 1419651.3, Improved Analogue-to-Digital Convertor, filed Nov. 4, 2014, 65 pages.
(Continued)

*Primary Examiner* — Akelaw Teshale
(74) *Attorney, Agent, or Firm* — Jackson Walker L.L.P.

(57) ABSTRACT

In accordance with embodiments of the present disclosure, a processing system may include multiple selectable processing paths for processing an analog signal in order to reduce noise, increase dynamic range, and mask audio artifacts associated with a change in noise floor. Techniques are employed to transition between processing paths and calibrate operational parameters of the two paths in order to reduce or eliminate artifacts caused by switching between processing paths.

22 Claims, 5 Drawing Sheets

(51) Int. Cl.
  *H03M 3/00* (2006.01)
  *H04H 20/10* (2008.01)

(56) References Cited

U.S. PATENT DOCUMENTS

| | | | |
|---|---|---|---|
| 4,493,091 A | 1/1985 | Gundry | |
| 4,890,107 A | 12/1989 | Pearce | |
| 4,972,436 A | 11/1990 | Halim et al. | |
| 4,999,628 A | 3/1991 | Kakaubo et al. | |
| 4,999,830 A | 3/1991 | Agazzi | |
| 5,077,539 A | 12/1991 | Howatt | |
| 5,148,167 A | 9/1992 | Ribner | |
| 5,198,814 A | 3/1993 | Ogawara et al. | |
| 5,272,449 A | 12/1993 | Izawa | |
| 5,321,758 A | 6/1994 | Charpentier et al. | |
| 5,323,159 A | 6/1994 | Imamura et al. | |
| 5,343,161 A | 8/1994 | Tokumo et al. | |
| 5,550,923 A | 8/1996 | Hotvet et al. | |
| 5,600,317 A | 2/1997 | Knoth et al. | |
| 5,714,956 A | 2/1998 | Jahne et al. | |
| 5,719,641 A | 2/1998 | Mizoguchi | |
| 5,796,303 A | 8/1998 | Vinn et al. | |
| 5,808,575 A | 9/1998 | Himeno et al. | |
| 5,810,477 A | 9/1998 | Abraham et al. | |
| 6,088,461 A | 7/2000 | Lin | |
| 6,160,455 A | 12/2000 | French et al. | |
| 6,201,490 B1 * | 3/2001 | Kawano | H03M 1/0626 341/139 |
| 6,271,780 B1 * | 8/2001 | Gong | H03M 3/488 341/139 |
| 6,333,707 B1 | 12/2001 | Oberhammer et al. | |
| 6,353,404 B1 * | 3/2002 | Kuroiwa | H03M 1/70 341/139 |
| 6,542,612 B1 | 4/2003 | Needham | |
| 6,614,297 B2 | 9/2003 | Score et al. | |
| 6,683,494 B2 | 1/2004 | Stanley | |
| 6,745,355 B1 | 6/2004 | Tamura | |
| 6,768,443 B2 | 7/2004 | Willis | |
| 6,822,595 B1 | 11/2004 | Robinson | |
| 6,853,242 B2 | 2/2005 | Melanson et al. | |
| 6,888,888 B1 | 5/2005 | Tu et al. | |
| 6,897,794 B2 | 5/2005 | Kuyel et al. | |
| 6,989,955 B2 | 1/2006 | Ziemer et al. | |
| 7,020,892 B2 | 3/2006 | Levesque et al. | |
| 7,023,268 B1 | 4/2006 | Taylor et al. | |
| 7,061,312 B2 | 6/2006 | Andersen et al. | |
| 7,167,112 B2 | 1/2007 | Andersen et al. | |
| 7,216,249 B2 | 5/2007 | Fujiwara et al. | |
| 7,279,964 B2 | 10/2007 | Bolz et al. | |
| 7,302,354 B2 | 11/2007 | Zhuge | |
| 7,312,734 B2 | 12/2007 | McNeill et al. | |
| 7,315,204 B2 | 1/2008 | Seven | |
| 7,365,664 B2 | 4/2008 | Caduff et al. | |
| 7,378,902 B2 | 5/2008 | Sorrells et al. | |
| 7,385,443 B1 | 6/2008 | Denison | |
| 7,403,010 B1 | 7/2008 | Hertz | |
| 7,440,891 B1 | 10/2008 | Shozakai et al. | |
| 7,522,677 B2 | 4/2009 | Liang | |
| 7,583,215 B2 | 9/2009 | Yamamoto et al. | |
| 7,671,768 B2 | 3/2010 | De Ceuninck | |
| 7,679,538 B2 | 3/2010 | Tsang | |
| 7,737,776 B1 | 6/2010 | Cyrusian | |
| 7,893,856 B2 | 2/2011 | Ek et al. | |
| 7,924,189 B2 | 4/2011 | Sayers | |
| 7,937,106 B2 | 5/2011 | Sorrells et al. | |
| 8,060,663 B2 | 11/2011 | Murray et al. | |
| 8,130,126 B2 | 3/2012 | Breitschaedel et al. | |
| 8,298,425 B2 | 10/2012 | Kanbe | |
| 8,330,631 B2 | 12/2012 | Kumar et al. | |
| 8,362,936 B2 | 1/2013 | Ledzius et al. | |
| 8,462,035 B2 | 6/2013 | Schimper et al. | |
| 8,483,753 B2 | 7/2013 | Behzad et al. | |
| 8,508,397 B2 | 8/2013 | Hisch | |
| 8,717,211 B2 | 5/2014 | Miao et al. | |
| 8,786,477 B1 | 7/2014 | Albinet | |
| 8,836,551 B2 | 9/2014 | Nozaki | |
| 8,873,182 B2 | 10/2014 | Liao et al. | |
| 8,878,708 B1 * | 11/2014 | Sanders | H03M 1/70 341/139 |
| 8,952,837 B2 | 2/2015 | Kim et al. | |
| 9,071,201 B2 | 6/2015 | Jones et al. | |
| 9,071,267 B1 | 6/2015 | Schneider et al. | |
| 9,071,268 B1 | 6/2015 | Schneider et al. | |
| 9,118,401 B1 | 8/2015 | Nieto et al. | |
| 9,148,164 B1 | 9/2015 | Schneider et al. | |
| 9,171,552 B1 | 10/2015 | Yang | |
| 9,178,462 B2 | 11/2015 | Kurosawa et al. | |
| 9,210,506 B1 | 12/2015 | Nawfal et al. | |
| 9,306,588 B2 | 4/2016 | Das et al. | |
| 9,337,795 B2 | 5/2016 | Das et al. | |
| 9,391,576 B1 | 7/2016 | Satoskar et al. | |
| 9,503,027 B2 | 11/2016 | Zanbaghi | |
| 9,525,940 B1 | 12/2016 | Schneider et al. | |
| 9,543,975 B1 | 1/2017 | Melanson et al. | |
| 9,584,911 B2 | 2/2017 | Das et al. | |
| 9,596,537 B2 | 3/2017 | He et al. | |
| 9,635,310 B2 | 4/2017 | Chang et al. | |
| 9,807,504 B2 | 10/2017 | Melanson et al. | |
| 9,813,814 B1 | 11/2017 | Satoskar | |
| 9,831,843 B1 | 11/2017 | Das et al. | |
| 2001/0001547 A1 | 5/2001 | Delano et al. | |
| 2001/0009565 A1 | 7/2001 | Singvall | |
| 2004/0078200 A1 | 4/2004 | Alves | |
| 2004/0184621 A1 | 9/2004 | Andersen et al. | |
| 2005/0068076 A1 | 3/2005 | Kim et al. | |
| 2005/0084037 A1 | 4/2005 | Liang | |
| 2005/0258989 A1 | 11/2005 | Li et al. | |
| 2005/0276359 A1 * | 12/2005 | Xiong | H03G 3/001 375/345 |
| 2006/0056491 A1 | 3/2006 | Lim et al. | |
| 2006/0064037 A1 | 3/2006 | Shalon et al. | |
| 2006/0098827 A1 | 5/2006 | Paddock et al. | |
| 2006/0261886 A1 | 11/2006 | Hansen et al. | |
| 2006/0284675 A1 | 12/2006 | Krochmal et al. | |
| 2007/0018719 A1 | 1/2007 | Seven | |
| 2007/0026837 A1 | 2/2007 | Bagchi | |
| 2007/0057720 A1 | 3/2007 | Hand et al. | |
| 2007/0092089 A1 | 4/2007 | Seefeldt et al. | |
| 2007/0103355 A1 | 5/2007 | Yamada | |
| 2007/0120721 A1 | 5/2007 | Caduff et al. | |
| 2007/0123184 A1 | 5/2007 | Nesimoglu et al. | |
| 2007/0146069 A1 | 6/2007 | Wu et al. | |
| 2008/0012639 A1 | 1/2008 | Mels | |
| 2008/0030577 A1 | 2/2008 | Cleary et al. | |
| 2008/0114239 A1 | 5/2008 | Randall et al. | |
| 2008/0143436 A1 | 6/2008 | Xu | |
| 2008/0159444 A1 | 7/2008 | Terada | |
| 2008/0198048 A1 | 8/2008 | Klein et al. | |
| 2008/0292107 A1 | 11/2008 | Bizjak | |
| 2009/0015327 A1 | 1/2009 | Wu et al. | |
| 2009/0021643 A1 | 1/2009 | Hsueh et al. | |
| 2009/0051423 A1 | 2/2009 | Miaille et al. | |
| 2009/0058531 A1 | 3/2009 | Hwang et al. | |
| 2009/0084586 A1 | 4/2009 | Nielsen | |
| 2009/0220110 A1 | 9/2009 | Bazarjani et al. | |
| 2010/0168882 A1 | 7/2010 | Zhang et al. | |
| 2010/0183163 A1 | 7/2010 | Matsui et al. | |
| 2011/0013733 A1 | 1/2011 | Martens et al. | |
| 2011/0025540 A1 | 2/2011 | Katsis | |
| 2011/0029109 A1 | 2/2011 | Thomsen et al. | |
| 2011/0063148 A1 | 3/2011 | Kolze et al. | |
| 2011/0096370 A1 | 4/2011 | Okamoto | |
| 2011/0136455 A1 | 6/2011 | Sundstrom et al. | |
| 2011/0150240 A1 | 6/2011 | Akiyama et al. | |
| 2011/0170709 A1 | 7/2011 | Guthrie et al. | |
| 2011/0188671 A1 | 8/2011 | Anderson et al. | |
| 2011/0228952 A1 | 9/2011 | Lin | |
| 2011/0242614 A1 | 10/2011 | Okada | |
| 2011/0268301 A1 | 11/2011 | Nielsen et al. | |
| 2011/0285463 A1 | 11/2011 | Walker et al. | |
| 2012/0001786 A1 | 1/2012 | Hisch | |
| 2012/0047535 A1 | 2/2012 | Bennett et al. | |
| 2012/0133411 A1 | 5/2012 | Miao et al. | |
| 2012/0177201 A1 | 7/2012 | Ayling et al. | |

(56) References Cited

U.S. PATENT DOCUMENTS

| | | | |
|---|---|---|---|
| 2012/0177226 A1 | 7/2012 | Silverstein et al. | |
| 2012/0188111 A1 | 7/2012 | Ledzius et al. | |
| 2012/0207315 A1 | 8/2012 | Kimura et al. | |
| 2012/0242521 A1 | 9/2012 | Kinyua | |
| 2012/0250893 A1 | 10/2012 | Carroll et al. | |
| 2012/0263090 A1 | 10/2012 | Porat et al. | |
| 2012/0274490 A1 | 11/2012 | Kidambi et al. | |
| 2012/0280726 A1 | 11/2012 | Colombo et al. | |
| 2013/0095870 A1 | 4/2013 | Phillips et al. | |
| 2013/0106635 A1 | 5/2013 | Doi | |
| 2013/0129117 A1* | 5/2013 | Thomsen | H04R 3/00 381/111 |
| 2013/0188808 A1 | 7/2013 | Pereira et al. | |
| 2013/0241753 A1 | 9/2013 | Nozaki | |
| 2013/0241755 A1 | 9/2013 | Chen et al. | |
| 2014/0044280 A1 | 2/2014 | Jiang | |
| 2014/0105256 A1 | 4/2014 | Hanevich et al. | |
| 2014/0105273 A1 | 4/2014 | Chen et al. | |
| 2014/0126747 A1 | 5/2014 | Huang | |
| 2014/0135077 A1 | 5/2014 | Leviant et al. | |
| 2014/0184332 A1 | 7/2014 | Shi et al. | |
| 2014/0269118 A1 | 9/2014 | Taylor et al. | |
| 2014/0368364 A1 | 12/2014 | Hsu | |
| 2015/0009079 A1 | 1/2015 | Bojer | |
| 2015/0170663 A1 | 6/2015 | Disch et al. | |
| 2015/0214974 A1 | 7/2015 | Currivan | |
| 2015/0214975 A1 | 7/2015 | Gomez et al. | |
| 2015/0249466 A1 | 9/2015 | Elyada | |
| 2015/0295584 A1 | 10/2015 | Das et al. | |
| 2015/0327174 A1 | 11/2015 | Rajagopal et al. | |
| 2015/0381130 A1 | 12/2015 | Das et al. | |
| 2016/0072465 A1 | 3/2016 | Das et al. | |
| 2016/0080862 A1 | 3/2016 | He et al. | |
| 2016/0080865 A1 | 3/2016 | He et al. | |
| 2016/0173112 A1 | 6/2016 | Das et al. | |
| 2016/0181988 A1 | 6/2016 | Du et al. | |
| 2016/0286310 A1 | 9/2016 | Das et al. | |
| 2016/0365081 A1 | 12/2016 | Satoskar et al. | |
| 2017/0047895 A1 | 2/2017 | Zanbaghi | |
| 2017/0150257 A1 | 5/2017 | Das et al. | |

FOREIGN PATENT DOCUMENTS

| | | |
|---|---|---|
| EP | 1244218 A1 | 9/2002 |
| EP | 1575164 A2 | 9/2005 |
| EP | 1689075 A1 | 8/2006 |
| EP | 1753130 A1 | 2/2007 |
| EP | 1798852 A2 | 6/2009 |
| EP | 2207264 A1 | 7/2010 |
| GB | 1599401 A | 9/1981 |
| GB | 2119189 A | 11/1983 |
| GB | 2307121 A | 6/1997 |
| GB | 2507096 A | 4/2014 |
| GB | 2527637 A | 12/2015 |
| GB | 2527677 B | 10/2016 |
| GB | 2537694 A | 10/2016 |
| GB | 2537697 A | 10/2016 |
| GB | 2539517 A | 12/2016 |
| JP | 2008294803 A | 12/2008 |
| WO | WO0054403 A1 | 9/2000 |
| WO | 02/37686 A2 | 5/2002 |
| WO | 2006018750 A1 | 2/2006 |
| WO | 2007005380 A2 | 1/2007 |
| WO | 2007136800 A2 | 11/2007 |
| WO | 2008067260 A1 | 6/2008 |
| WO | 2014113471 A1 | 7/2014 |
| WO | 2015160655 | 10/2015 |
| WO | 2016040165 A1 | 3/2016 |
| WO | 2016040171 A1 | 3/2016 |
| WO | 2016040177 A1 | 3/2016 |
| WO | 2016160336 A1 | 10/2016 |
| WO | 2016202636 A1 | 12/2016 |

OTHER PUBLICATIONS

International Search Report and Written Opinion, International Application No. PCT/US2015/056357, dated Jan. 29, 2015, 13 pages.

Thaden, Rainer et al., A Loudspeaker Management System with FIR/IRR Filtering; AES 32nd International Conference, Hillerod, Denmark, Sep. 21-23, 2007; pp. 1-12.

Thaden, Rainer et al., A Loudspeaker Management System with FIR/IRR Filtering; Slides from a presentation given at the 32nd AES conference "DSP for Loudspeakers" in Hillerod, Denmark in Sep. 2007; http://www.four-audio.com/data/AES32/AES32FourAudio.pdf; 23 pages.

Combined Search and Examination Report, GB Application No. GB1510578.6, dated Aug. 3, 2015, 3 pages.

Combined Search and Examination Report, GB Application No. GB1506258.1, dated Oct. 21, 2015, 6 pages.

International Search Report and Written Opinion, International Patent Application No. PCT/US2015/025329, dated Aug. 11, 2015, 9 pages.

International Search Report and Written Opinion, International Patent Application No. PCT/US2015/048633, dated Dec. 10, 2015, 11 pages.

International Search Report and Written Opinion, International Patent Application No. PCT/US2015/048591, dated Dec. 10, 2015, 11 pages.

Combined Search and Examination Report, GB Application No. GB1602288.1, dated Aug. 9, 2016, 6 pages.

International Search Report and Written Opinion of the International Searching Authority, International Application No. PCT/US2016/065134, dated Mar. 15, 2017.

Combined Search and Examination Report, GB Application No. GB1514512.1, dated Feb. 11, 2016, 7 pages.

International Search Report and Written Opinion, International Application No. PCT/US2015/048609, dated Mar. 23, 2016, 23 pages.

International Search Report and Written Opinion, International Application No. PCT/US2016/022578, dated Jun. 22, 2016, 12 pages.

Combined Search and Examination Report, GB Application No. GB1600528.2, dated Jul. 7, 2016, 8 pages.

Combined Search and Examination Report, GB Application No. GB1603628.7, dated Aug. 24, 2016, 6 pages.

International Search Report and Written Opinion, International Application No. PCT/EP2016/062862, dated Aug. 26, 2016, 14 pages.

Combined Search and Examination Report under Sections 17 and 18(3) of the UKIPO, Application No. GB1620427.3, dated Jun. 1, 2017.

Combined Search and Examination Report under Sections 17 and 18(3) of the UKIPO, Application No. GB1620428.1, dated Jul. 21, 2017.

Combined Search and Examination Report under Sections 17 and 18(3), United Kingdom Intellectual Property Office, Application No. GB1700371.6, dated Aug. 1, 2017.

International Search Report and Written Opinion of the International Searching Authority, International Application No. PCT/US2016/040096, dated Mar. 24, 2017.

International Search Report and Written Opinion of the International Searching Authority, International Application No. PCT/US2017/014240, dated Apr. 24, 2017.

Groeneweg, B.P., et al., A Class-AB/D Audio Power Amplifier for Mobile Applications Integrated Into a 2.5G/3G Baseband Processo1016r, IEEE Transactions on Circuits and Systems—I: Regular Papers, vol. 57, No. 5, May 2010, pp. 1003-1016.

Chen, K., et al., A High-PSRR Reconfigurable Class-AB/D Audio. Amplifier Driving a Hands-Free/Receiver. 2-in-1 Loudspeaker, IEEE Journal of Solid-State Circuits, vol. 47, No. 11, Nov. 2012, pp. 2586-2603.

Chen, Kuo-Hsin, et al., A 106dB PSRR Direct Battery Connected Reconfigurable Class-AB/D Speaker Amplifier for Hands-Free/

(56) References Cited

OTHER PUBLICATIONS

Receiver 2-in-1 Loudspeaker, Solid State Circuits Conference (A-SSCC), 2011 IEEE Asian, Nov. 14, 2011, pp. 221-224.
Combined Search and Examination Report under Sections 17 and 18(3), United Kingdom Intellectual Property Office, Application No. GB1702655.0, dated Oct. 24, 2017.
Combined Search and Examination Report under Sections 17 and 18(3), United Kingdom Intellectual Property Office, Application No. GB1706693.7, dated Oct. 26, 2017.
Combined Search and Examination Report under Sections 17 and 18(3), United Kingdom Intellectual Property Office, Application No. GB1706690.3, dated Oct. 30, 2017.
Search Report under Section 17, United Kingdom Intellectual Property Office, Application No. GB1702656.8, dated Oct. 31, 2017.
International Search Report and Written Opinion of the International Searching Authority, International Patent Application No. PCT/US2017/045861, dated Nov. 14, 2017.
International Search Report and Written Opinion of the International Searching Authority, International Patent Application No. PCT/US2017/046083, dated Nov. 14, 2017.
Combined Search and Examination Report under Sections 17 and 18(3), United Kingdom Intellectual Property Office, Application No. GB1708546.5, dated Nov. 22, 2017.
Combined Search and Examination Report under Sections 17 and 18(3), United Kingdom Intellectual Property Office, Application No. GB1708544.0, dated Nov. 28, 2017.
International Search Report and Written Opinion of the International Searching Authority, International Patent Application No. PCT/US2017/052439, dated Dec. 14, 2017.

* cited by examiner

SYSTEMS AND METHODS FOR REDUCING ARTIFACTS AND IMPROVING PERFORMANCE OF A MULTI-PATH ANALOG-TO-DIGITAL CONVERTER

FIELD OF DISCLOSURE

The present disclosure relates in general to signal processing systems, and more particularly, to multiple path signal processing systems.

BACKGROUND

The use of multipath analog-to-digital converters (ADCs) and analog front ends (AFEs) (e.g., two or more path ADCs/AFEs) in electrical circuits is known. Example multipath ADCs and AFEs and use of them in multiple electrical circuit paths are disclosed in U.S. patent application Ser. No. 14/476,507 entitled "Multi-Path Analog Front End and Analog-to-Digital Converter for a Signal Processing System" to Schneider et al. filed Sep. 3, 2014, U.S. patent application Ser. No. 14/480,180 entitled "Multi-Path Analog Front End and Analog-to-Digital Converter for a Signal Processing System" to Schneider et al. filed Sep. 8, 2014, U.S. patent application Ser. No. 14/480,263 entitled "Multi-Path Analog Front End and Analog-to-Digital Converter for a Signal Processing System" to Schneider et al. filed Sep. 8, 2014, and U.S. patent application Ser. No. 14/480,343 entitled "Multi-Path Analog Front End and Analog-to-Digital Converter for a Signal Processing System" to Schneider et al. filed Sep. 8, 2014 (collectively, the "Schneider Applications"). The use of multipath circuits may reduce noise as one path may be optimized for processing small amplitude signals (e.g., for processing low noise signals) while another circuit path with another set of ADC and AFE may be optimized for large amplitude signals (e.g., allowing for higher dynamic range).

An example application for multipath ADCs/AFEs is use in a circuit for an audio system application, such as an audio mixing board or in a digital microphone system. In designing a circuit with multipath ADCs/AFEs that are used in respective multiple circuit paths, a tradeoff may exist between allowing larger signal swing (e.g., to allow swing of a signal between larger scale amplitudes) and low noise. Furthermore, the multipath ADCs/AFEs may provide high dynamic range signal digitization, with higher dynamic range for a given input power, and lower overall area than would be possible with conventional means. In other words, by allowing a separate optimization for each type of signal (e.g., large and small signals) that is provided each respective path, multipath ADCs/AFEs allow the overall circuit to burn less power, consume less area, and save on other such design costs.

Despite their advantages, existing multipath ADC/AFE approaches have disadvantages and problems. For example, many existing approaches have disadvantages related to transitioning and switching between the multiple paths, as such switching may not be smooth, leading to undesirable signal artifacts, especially in audio applications in which such artifacts may be perceptible to a listener of an audio device. For example, when switching between two paths in a multipath AFEs/ADCs, the paths may have different noise floors, which may create an artifact sometimes referred to as a "breathing" artifact. In addition, in existing implementations, switching thresholds for switching between paths may not provide for the highest performance of an audio system at all frequency levels.

SUMMARY

In accordance with the teachings of the present disclosure, certain disadvantages and problems associated with implementation of a multiple AFE/ADC paths system may be reduced or eliminated.

In accordance with embodiments of the present disclosure, a method of ensuring an inaudible change in noise floor when transitioning between signal paths in a multiple-path analog-to-digital converter system may include detecting a condition for auditory masking of the change in the noise floor and transitioning between signal paths of the multiple-path analog-to-digital converter system in response to detecting the condition.

In accordance with these and other embodiments of the present disclosure, a processing system may include a controller and a plurality of processing paths including a first processing path and a second processing path. The first processing path may include a first analog-to-digital converter, wherein the first processing path is configured to convert an analog signal into a first digital signal. The second processing path may include a second analog-to-digital converter, wherein the second processing path is configured to convert the analog signal into a second digital signal. The controller may be configured to select one of the first digital signal and the second digital signal as a digital output signal of the processing system based on a magnitude of the analog input signal and when changing selection between the first digital signal and the second digital signal as the digital output signal, transition between the first digital signal and the second digital signal such that during the transition, the digital output signal is a weighted average of the first digital signal and the second digital signal wherein a weight of the first digital signal relative to a weight of the second digital signal increases or decreases during the transition. The controller may also be configured to ensure an inaudible change in noise floor when transitioning between the first processing path and the second processing path by detecting a condition for auditory masking of the change in the noise floor and transitioning between the first processing path and the second processing path in response to detecting the condition.

In accordance with these and other embodiments of the present disclosure, a method of processing an audio signal in a multiple-path analog-to-digital converter system to achieve higher performance for a longer duration for certain frequencies of the audio signal when an error for certain frequencies is lesser than a corresponding error for other frequencies may include providing a frequency-dependent threshold for switching between signal paths of the multiple-path analog-to-digital converter system and switching between signal paths of the multiple-path analog-to-digital converter system in response to the audio signal having a magnitude at a frequency of the audio signal increasing above the frequency-dependent threshold at the frequency.

In accordance with these and other embodiments of the present disclosure, a processing system may include a controller and a plurality of processing paths including a first processing path and a second processing path. The first processing path may include a first analog-to-digital converter, wherein the first processing path is configured to convert an analog signal into a first digital signal. The second processing path may include a second analog-todigital converter, wherein the second processing path is configured to convert the analog signal into a second digital signal. The controller may be configured to switch between the first digital signal and the second digital signal in response to the analog signal having a magnitude at a frequency of the analog signal increasing above a frequency-dependent threshold at the frequency.

In accordance with these and other embodiments of the present disclosure, a method for configuring a noise floor level for a multiple-path analog-to-digital converter system having at least a first processing path for processing audio signals of lower magnitudes and a second processing path for processing audio signals of higher magnitudes and having an adjustable fading coefficient defining the relative levels by which the respective outputs of the first processing path and the second processing path contribute to an overall output signal generated by the multiple-path analog-to-digital converter system during a transition between selection of the first processing path and the second processing path may be provided. The method may include setting a minimum fading level of the fading coefficient to an intermediate fading level between that at which the first processing path contributes entirely to the overall output signal and that at which the second processing path contributes entirely to the overall output signal.

In accordance with these and other embodiments of the present disclosure, a processing system may include a controller and a plurality of processing paths including a first processing path for processing audio signals of lower magnitudes and a second processing path for processing audio signals of higher magnitudes. The first processing path may include a first analog-to-digital converter, wherein the first processing path is configured to convert an analog signal into a first digital signal. The second processing path may include a second analog-to-digital converter, wherein the second processing path is configured to convert the analog signal into a second digital signal. The controller may be configured to generate an adjustable fading coefficient defining the relative levels by which the respective outputs of the first processing path and the second processing path contribute to an overall digital output signal generated by the multiple-path analog-to-digital converter system during a transition between selection of the first processing path and the second processing path and set a minimum fading level of the fading coefficient to an intermediate fading level between that at which the first processing path contributes entirely to the overall digital output signal and that at which the second processing path contributes entirely to the overall digital output signal.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
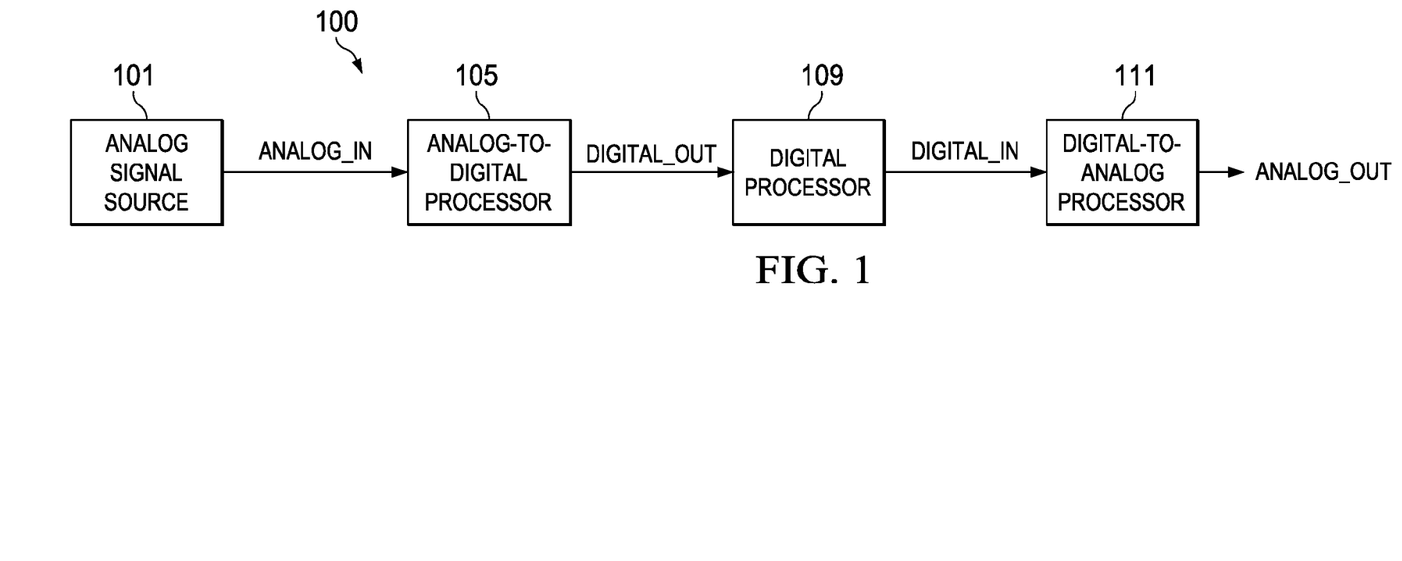
FIG. 1 illustrates a block diagram of selected components of an example signal processing system, in accordance with embodiments of the present disclosure.

FIG. 1 illustrates a block diagram of selected components of an example signal processing system 100, in accordance with embodiments of the present disclosure. As shown in FIG. 1, signal processing system 100 may include an analog signal source 101, an analog-to-digital processor 105, a digital processor 109, and a digital-to-analog processor 111. Analog signal source 101 may comprise any system, device, or apparatus configured to generate an analog electrical signal, for example an analog input signal ANALOG_IN. For example, in embodiments in which signal processing system 100 is an audio processing system, analog signal source 101 may comprise a microphone transducer or other audio signal source.

Analog-to-digital processor 105 may comprise any suitable system, device, or apparatus configured to process analog input signal ANALOG_IN to generate a digital output signal DIGITAL_OUT and condition digital output signal DIGITAL_OUT for transmission over a bus to digital processor 109. Once converted to digital output signal DIGITAL_OUT, the signal may be transmitted over significantly longer distances without being susceptible to noise as compared to an analog transmission over the same distance. In some embodiments, analog-to-digital processor 105 may be disposed in close proximity with analog signal source 101 to ensure that the length of the analog line between analog signal source 101 and analog-to-digital processor 105 is relatively short to minimize the amount of noise that can be picked up on an analog output line carrying analog input signal ANALOG_IN. For example, in some embodiments, analog signal source 101 and analog-to-digital processor 105 may be formed on the same substrate. In other embodiments, analog signal source 101 and analog-to-digital processor 105 may be formed on different substrates packaged within the same integrated circuit package.

Digital processor 109 may comprise any suitable system, device, or apparatus configured to process a digital output signal for use in a digital system. For example, digital processor 109 may comprise a microprocessor, microcontroller, digital signal processor (DSP), application specific integrated circuit (ASIC), or any other device configured to interpret and/or execute program instructions and/or process data, such as digital output signal DIGITAL_OUT.

Digital-to-analog processor 111 may comprise any suitable system, device, or apparatus configured to process digital output signal DIGITAL_OUT as processed by digital processor 109 to generate a corresponding analog output signal ANALOG_OUT. In some embodiments, analog output signal ANALOG_OUT may be communicated to an audio transducer (e.g., a loudspeaker) for generating sound.

Signal processing system 100 may be used in any application in which it is desired to process an analog signal to generate a digital signal and/or process a digital signal to generate an analog signal. Thus, in some embodiments, signal processing system 100 may be integral to an audio device that converts analog signals (e.g., from a microphone) to digital signals representing the sound incident on a microphone and/or converts such digital signals to analog signals for generating sounds at a loudspeaker. As another example, signal processing system 100 may be integral to a radio-frequency device (e.g., a mobile telephone) to convert radio-frequency analog signals into digital signals or vice versa.

Figure 2:
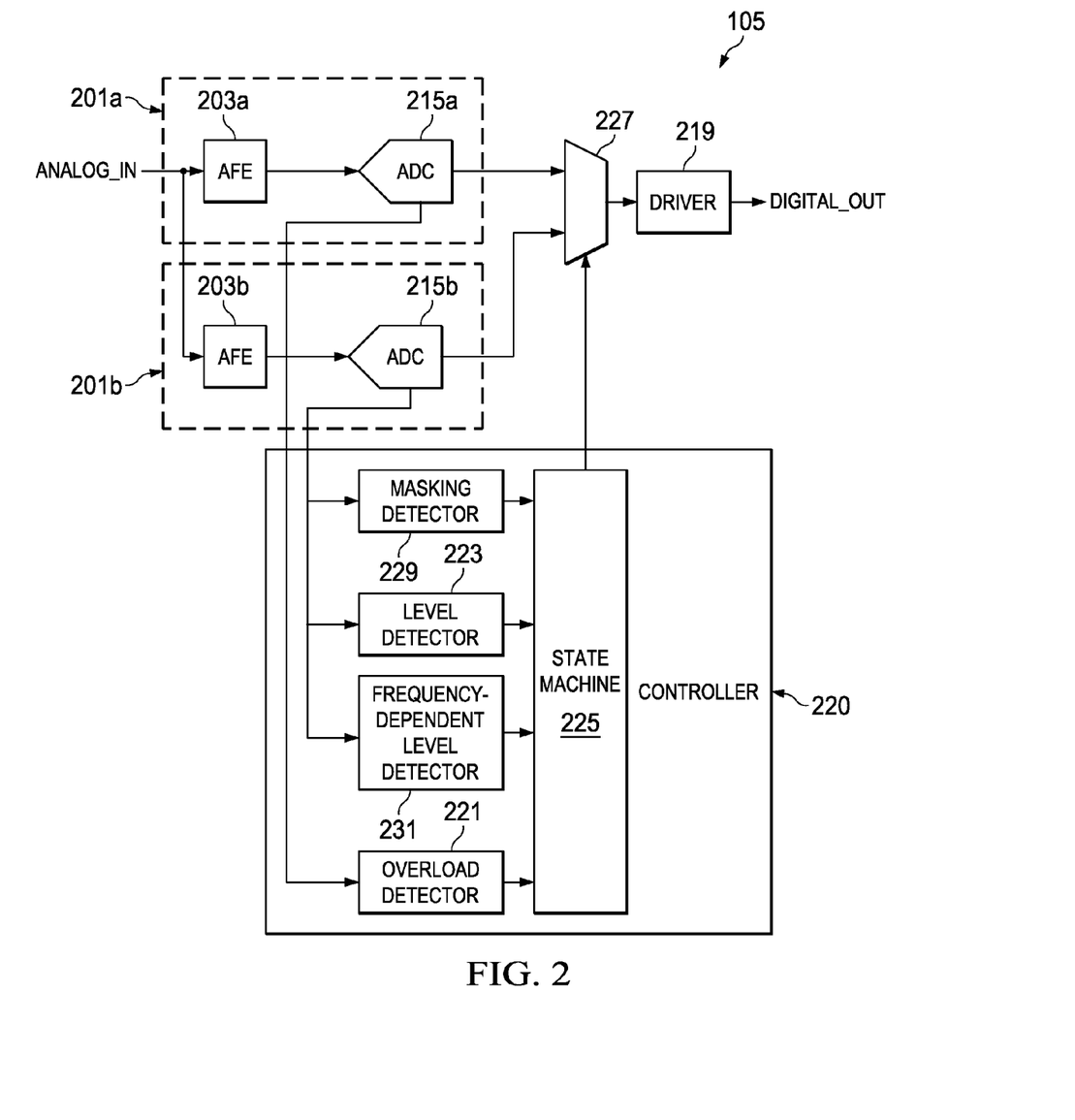
FIG. 2 illustrates a block diagram of selected components of an example integrated circuit for processing an analog signal to generate a digital signal, in accordance with embodiments of the present disclosure.

FIG. 2 illustrates a block diagram of selected components of analog-to-digital processor 105, in accordance with embodiments of the present disclosure. As shown in FIG. 2, analog-to-digital processor 105 may include two or more processing paths 201a and 201b (which may be referred to herein individually as a processing path 201 and collectively as processing paths 201), each processing path 201 including a respective AFE 203 (e.g., AFE 203a, AFE 203b) and a respective ADC (e.g., ADC 215a, ADC 215b). In some embodiments, first processing path 201a may be adapted for processing analog input signal ANALOG_IN having lower magnitudes and second processing path 201b may be adapted for processing analog input signal ANALOG_IN having higher magnitudes.

An AFE 203 may receive analog input signal ANALOG_IN via one or more input lines which may allow for receipt of a single-ended signal, differential signal, or any other suitable analog signal format and may comprise any suitable system, device, or apparatus configured to condition analog input signal ANALOG_IN for processing by ADC 215. In some embodiments, AFEs 203a and 203b may be implemented in a manner identical or similar to that disclosed in the Schneider Applications. The output of each AFE 203 may be communicated to a respective ADC 215 on one or more output lines.

An ADC 215 may comprise any suitable system, device, or apparatus configured to convert an analog signal received at its input, to a digital signal representative of analog input signal ANALOG_IN. ADC 215 may itself include one or more components (e.g., delta-sigma modulator, decimator, etc.) for carrying out the functionality of ADC 215. In some embodiments, ADCs 215a and 215b may be implemented in a manner identical or similar to that disclosed in the Schneider Applications.

A multiplexer 227 may receive a respective digital signal from each of processing paths 201 and may select one of the digital signals as digital output signal DIGITAL_OUT based on a control signal generated by and communicated from a controller 220. For example, in response to a control signal from controller 220, for magnitudes of analog input signal ANALOG_IN below a threshold magnitude, multiplexer 227 may select the digital signal generated by processing path 201a and for magnitudes of analog input signal ANALOG_IN above the same or a different threshold magnitude, multiplexer 227 may select the digital signal generated by processing path 201b.

In some embodiments, multiplexer 227 may also, during a transition between selection of the digital signals as digital output signal DIGITAL_OUT, apply a relative proportion of each of the digital signals input to multiplexer 227 according to an adjustable fading coefficient communicated from controller 220 which defines the relative levels by which the respective inputs of multiplexer 227 contribute to digital output signal DIGITAL_OUT. Thus, during such a transition between processing paths 201, the adjustable fading coefficient may increase or decrease to fade between the digital signal output by processing path 201a and the digital signal output by processing path 201b, or vice versa. Such crossfading between the outputs of processing paths 201 may be beneficial to reduce or eliminate signal artifacts that may occur due to gain error differences, phase error differences, and/or other differences between processing paths 201.

Driver 219 may receive the digital signal DIGITAL_OUT output by ADC 215 and may comprise any suitable system, device, or apparatus configured to condition such digital signal (e.g., encoding into Audio Engineering Society/European Broadcasting Union (AES/EBU), Sony/Philips Digital Interface Format (S/PDIF)), in the process generating digital output signal DIGITAL_OUT for transmission over a bus to digital processor 109. In FIG. 2, the bus receiving digital output signal DIGITAL_OUT is shown as single-ended. In some embodiments, driver 219 may generate a differential digital output signal DIGITAL_OUT.

Controller 220 may comprise any suitable system, device, or apparatus for selecting one of the digital signals output by the various processing paths 201 as digital output signal DIGITAL_OUT and controlling transitions between the selections of the processing paths. In some embodiments, controller 220 may make such selection based on a magnitude of analog input signal ANALOG_IN or a signal derivative thereof. For example, controller 220 may include an overload detector 221 that may determine whether or not a signal derivative of analog input signal ANALOG_IN is likely to cause clipping or other distortion of digital output signal DIGITAL_OUT if a particular processing path (e.g., processing path 201a) is selected. If clipping or other distortion of digital output signal DIGITAL_OUT is likely if the particular processing path (e.g., processing path 201a) is selected, state machine 225 of controller 220 may generate a control signal so that another processing path (e.g., processing path 201b) is selected. As mentioned above, in some embodiments, processing path 201a may be a path adapted for low amplitudes of analog input signal ANALOG_IN and may thus have a high signal gain, while processing path 201b may be a path adapted for higher amplitudes of analog input signal ANALOG_IN and may thus have a lower signal gain. Thus, if analog input signal ANALOG_IN or a derivative thereof is greater than a threshold value indicative of a condition whereby digital output signal DIGITAL_OUT may experience clipping or other distortion if processing path 201a is selected, overload detector 221 may detect such condition, and cause state machine 225 to generate a control signal to select the digital signal generated by processing path 201b as digital output signal DIGITAL_OUT.

As another example, controller 220 may include a level detector 223 that may detect an amplitude of analog input signal ANALOG_IN or a signal derivative thereof (e.g., a signal generated within ADC 215b) and communicate a signal indicative of such amplitude to state machine 225. Responsive to the signal received from level detector 223, state machine 225 may generate the control signal communicated to multiplexer 227. To illustrate, as analog input signal ANALOG_IN decreases from a relatively high amplitude to a lower amplitude, it may cross a threshold amplitude level whereby controller 220 may change the selection of digital output signal DIGITAL_OUT from the digital signal generated by processing path 201b (which may be adapted for higher amplitudes of analog input signal ANALOG_IN) to the digital signal generated by processing path 201a (which may be adapted for lower amplitudes of analog input signal ANALOG_IN).

Figure 3:
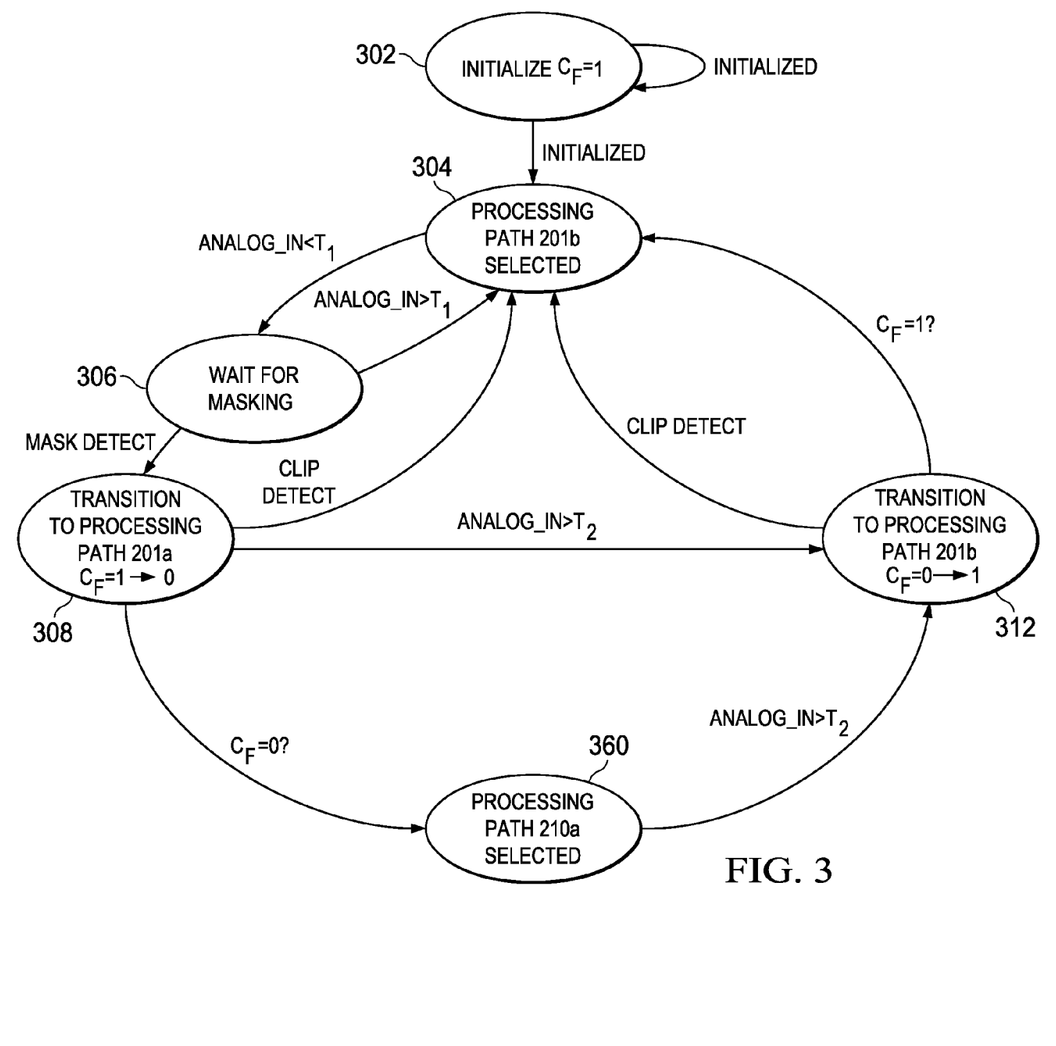
FIG. 3 illustrates a diagram of an example state machine for use in an integrated circuit for processing an analog signal to generate a digital signal, in accordance with embodiments of the present disclosure.

As another example, controller 220 may include a frequency-dependent level detector 231 that may detect amplitudes of analog input signal ANALOG_IN or a signal derivative thereof (e.g., a signal generated within ADC 215b) at various frequencies and communicate a signal indicative of such amplitude to state machine 225. Responsive to the signal received from frequency-dependent level detector 231, state machine 225 may generate the control signal communicated to multiplexer 227. To illustrate, frequency-dependent level detector 231 may apply a frequency-dependent threshold as depicted in FIG. 3, in which the threshold is lower at lower frequencies of analog input signal ANALOG_IN and increases at higher frequencies of analog input signal ANALOG_IN. Thus, as analog input signal ANALOG_IN increases from a relatively low amplitude to a higher amplitude, spectral components at higher frequencies may require higher magnitude at such frequencies to cross the frequency-dependent threshold in order to cause a transition between selection of digital output signal DIGITAL_OUT from the digital signal generated by processing path 201a (which may be adapted for lower amplitudes of analog input signal ANALOG_IN) to the digital signal generated by processing path 201b (which may be adapted for higher amplitudes of analog input signal ANALOG_IN). A higher threshold at higher frequencies (and thus, a quicker cross-fade transition between processing paths 201 in response to crossing the higher frequency) may be tolerable as gain error, phase error, and/or other errors between processing paths 201 may be lower at higher frequencies and/or auditory masking in audio systems at higher frequencies may permit more gain error, phase error, and/or other errors to be tolerated than at lower frequencies.

Such a frequency-dependent threshold may thus be effective to allow system 100 to achieve higher performance for a longer duration for certain frequencies of the audio signal when a path error for certain frequencies is lesser than a corresponding error for other frequencies. Further discussion including an example of a frequency-dependent threshold is described in greater detail below.

In some embodiments, with respect to the threshold magnitudes for switching applied by level detector 223 and frequency-dependent level detector 231, a threshold amplitude level whereby controller 220 may change the selection of digital output signal DIGITAL_OUT from the digital signal generated by processing path 201b to the digital signal generated by processing path 201a may be lower than another threshold amplitude level whereby controller 220 may change the selection of digital output signal DIGITAL_OUT from the digital signal generated by processing path 201a to the digital signal generated by processing path 201b, in order to provide for hysteresis so that multiplexer 227 does not repeatedly switch between the paths.

As another example, controller 220 may include a masking detector 229 that may detect for presence of an auditory masking component of analog input signal ANALOG_IN that is likely to audibly mask a change in the noise floor of system 100 when switching between selection of digital output signal DIGITAL_OUT from the digital signal generated by processing path 201b to the digital signal generated by processing path 201a, or vice versa. To illustrate, in particular embodiments of system 100, the presence of a 50 Hz signal that repeatedly crosses thresholds for switching between processing paths 201 may cause frequency switching between processing paths 201, which may lead to noticeable noise floor modulation. However, to mask audible noise floor modulation, masking detector 229 may detect the presence within analog input signal ANALOG_IN of content to audibly mask the noise floor modulation. For example, content that may mask noise floor modulation may comprise a 1 KHz component at a magnitude of −60 decibels relative to full-scale magnitude (dBFs). Thus, masking detector 229 may detect such content, communicate a signal to state machine 225 indicating the presence of such content, responsive to which state machine 225 may control switching between processing paths 201. In some embodiments, masking detector 229 may operate by filtering analog input signal ANALOG_IN based on the spectral content of analog input signal ANALOG_IN to generate a frequency-filtered input signal, and then determining whether a magnitude of the frequency-filtered input signal is above a predetermined threshold magnitude at any frequency for indicating the presence of auditory masking. In some embodiments, filtering analog input signal ANALOG_IN comprises filtering with a filter that models relative loudness perceived by a human ear as a function of frequency of sound incident on the human ear. In such embodiments, such filter may include one of an A-weighting filter and an ISO 226 filter.

As stated above, state machine 225 may receive one or more signals indicative of characteristics of analog input signal ANALOG_IN (e.g., from overload detector 221, level detector 223, frequency-dependent level detector 231, and masking detector 229) and based thereon generate one or more control signals for digital output signal DIGITAL_OUT from the digital signal generated by processing path 201a and processing path 201b, and controlling transition between such digital signals when switching. FIG. 3 illustrates a diagram of an example state machine 225 for use in system 100, in accordance with embodiments of the present disclosure.

As shown in FIG. 3, state machine 225 may initialize in state 302, in which analog-to-digital processor 105 may initialize and an adjustable fading coefficient $C_F$ may be set to an initial value (e.g., 1). Adjustable fading coefficient $C_F$ may be a positive number between 0 and 1 that defines the relative levels by which the respective outputs of processing path 201a and processing path 201b contribute to digital output signal DIGITAL_OUT. In other words, the value of digital output signal DIGITAL_OUT may be given by the equation:

$$\text{DIGITAL\_OUT} = C_F \times \text{OUTPUT}_{201b} + (1 - C_F) \times \text{OUTPUT}_{201a}$$

Where $\text{OUTPUT}_{201a}$ is the output of processing path 201a and $\text{OUTPUT}_{201b}$ is the output of processing path 201b. Thus, initializing adjustable fading coefficient $C_F$ to a value of 1 means that analog-to-digital processor 105 initializes to a state in which digital output signal DIGITAL_OUT equals the digital output generated by processing path 201b. State machine 225 may remain at state 302 until analog-to-digital processor 105 has been initialized, after which state machine 225 may transition to state 304.

State 304 represents the condition when the output of processing path 201b is selected and adjustable fading coefficient $C_F$ is equal to its maximum value (e.g., 1), such that state machine 225 causes multiplexer 227 to pass the output of processing path 201b to digital output signal DIGITAL_OUT. State machine 225 may remain in state 304 until such time as a condition for selecting the output of processing path 201a as digital output signal DIGITAL_OUT occurs, at which state machine 225 may transition to state 306. In some embodiments, such condition may comprise analog input signal ANALOG_IN decreasing below a predetermined threshold $T_1$ (e.g., −35 dBFs). In these embodiments, such condition may also include input signal ANALOG_IN decreasing below predetermined threshold $T_1$ for a minimum duration of time (e.g., 400 ms).

At state 306, adjustable fading coefficient $C_F$ may be equal to its maximum value (e.g., 1), such that state machine 225 causes multiplexer 227 to pass the output of processing path 201b to digital output signal DIGITAL_OUT. In state 306, state machine 225 may wait for a signal from masking detector 229 indicating the presence of content within input signal ANALOG_IN to mask a change in noise floor caused by switching between processing paths 201. If masking detector 229 provides such a signal to state machine 225 while analog input signal ANALOG_IN remains below predetermined threshold $T_1$, state machine 225 may transition to state 308. Otherwise, if analog input signal ANALOG_IN rises above predetermined threshold $T_1$ before the masking signal is received from masking detector 229, state machine 225 may again transition to state 304.

At state 308, state machine 225 may generate a control signal to multiplexer 227 such that the value of adjustable fading coefficient $C_F$ ramps from its maximum value (e.g., 1) to its minimum value (e.g., 0). For example, in some embodiments, state machine 225 may cause the value of adjustable fading coefficient $C_F$ to ramp from its maximum value to its minimum value in a number of steps (e.g., 128) occurring at regular intervals (e.g., each sampling interval of analog input signal ANALOG_IN).

Although FIG. 3 indicates a value of 0 for the minimum value of adjustable fading coefficient $C_F$, in some embodiments, the minimum fading level of adjustable fading coefficient $C_F$ may be configurable (e.g., by a manufacturer, designer, vendor, or other provider of system 100, or a user of system 100) to a value of other than 0. The effect of setting the minimum value of adjustable fading coefficient $C_F$ to a value of other than 0 is that it may raise the effective noise floor when processing path 201a is selected, which in turn may reduce the magnitude of change of the noise floor when switching between processing path 201b and processing path 201a, in order to reduce or eliminate audio artifacts associated with a change in noise floor. In some embodiments, controller 220 may be configured to set the minimum value of adjustable fading coefficient $C_F$ to a value of other than 0 in response to detecting a condition in which a transition between selection of processing path 201b and processing path 201a is likely to cause an audibly-detectable change in the noise floor level. In some of such embodiments, the condition may be where a total gain of one or both of processing paths 201 is likely to cause an audibly-detectable change in the noise floor level.

State machine 225 may transition from state 308 to state 310 once adjustable fading coefficient $C_F$ has reached its minimum value. However, if before adjustable fading coefficient $C_F$ reaches its minimum value, overload detector 221 detects a condition whereby digital output signal DIGITAL_OUT may experience clipping or other distortion if processing path 201a is selected, state machine 225 may immediately transition to state 304 and set adjustable fading coefficient $C_F$ to its maximum value to avoid clipping or other distortion. In addition, should frequency-dependent level detector 231 detect a condition for selecting the output of processing path 201b as digital output signal DIGITAL_OUT (e.g., analog input signal ANALOG_IN exceeding a frequency-dependent threshold $T_2$), state machine 225 may transition to state 312. In some embodiments, frequency-dependent threshold $T_2$ may be greater than predetermined threshold $T_1$.

State 310 represents the condition when the output of processing path 201a is selected and adjustable fading coefficient $C_F$ is equal to its minimum value (e.g., 0), such that state machine 225 causes multiplexer 227 to pass the output of processing path 201a to digital output signal DIGITAL_OUT. State machine 225 may remain in state 310 until such time as a condition for selecting the output of processing path 201b as digital output signal DIGITAL_OUT occurs, after which state machine 225 may transition to state 312. In some embodiments, such condition may comprise analog input signal ANALOG_IN increasing above frequency-dependent threshold $T_2$.

At state 312, state machine 225 may generate a control signal to multiplexer 227 such that the value of adjustable fading coefficient $C_F$ ramps from its minimum value (e.g., 0) to its maximum value (e.g., 1). It is noted that if state machine 225 transitions to state 312 from state 308, adjustable fading coefficient $C_F$ may not have ramped entirely to its minimum value and thus may have a value greater than its minimum value when state 312 occurs. Accordingly, in such cases, adjustable fading coefficient $C_F$ may ramp to its maximum value from its value at such time state machine 225 transitions from state 308 to state 312. In some embodiments, state machine 225 may cause the value of adjustable fading coefficient $C_F$ to ramp to its maximum value in a number of steps occurring at regular intervals. In the same or alternative embodiments, state machine 225 may cause adjustable fading coefficient $C_F$ to ramp to its maximum value based on the magnitude of analog input signal ANALOG_IN, as described in greater detail below with respect to FIG. 4.

State machine 225 may transition from state 312 to state 304 once adjustable fading coefficient $C_F$ has reached its maximum value. However, if before adjustable fading coefficient $C_F$ reaches its maximum value, overload detector 221 detects a condition whereby digital output signal DIGITAL_OUT may experience clipping or other distortion if processing path 201a is selected, state machine 225 may immediately transition to state 304 and set adjustable fading coefficient $C_F$ to its maximum value to avoid clipping or other distortion.

Figure 4:
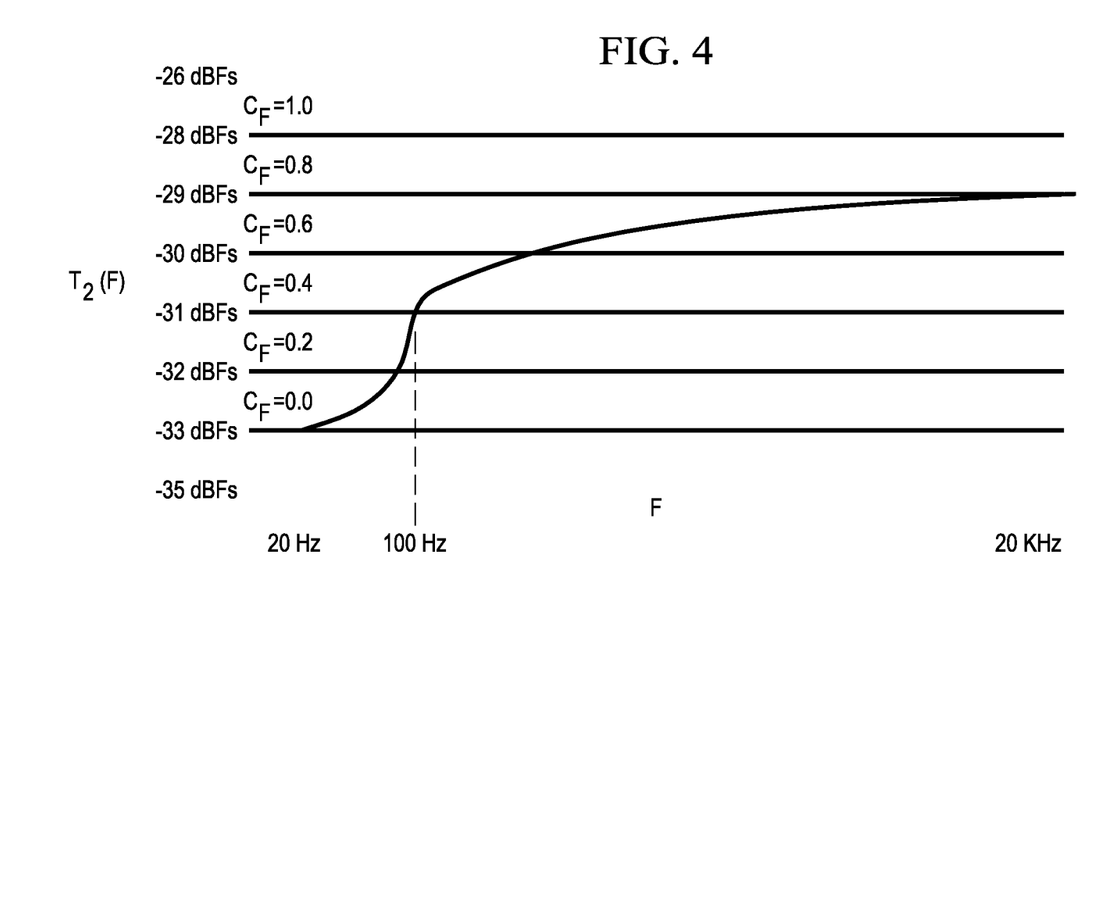
FIG. 4 illustrates a graph depicting an example frequency-dependent threshold for switching between processing paths, in accordance with embodiments of the present disclosure.

As described above, frequency-dependent level detector 231 may apply a frequency-dependent level threshold for switching between processing path 201a and processing path 201b. FIG. 4 illustrates a graph depicting an example frequency-dependent threshold $T_2$ for switching between processing paths 201, in accordance with embodiments of the present disclosure. As shown in FIG. 4, frequency-dependent threshold $T_2$ may vary with frequency $f$ of analog input signal ANALOG_IN. For example, in the embodiments represented by FIG. 4, frequency-dependent threshold $T_2$ may comprise a monotonically-increasing function of frequency $f$. Such frequency-dependent threshold may represent, at various respective frequencies, the magnitude of analog input signal ANALOG_IN required at such respective frequencies in order to cross the threshold and switch selection from the digital output of processing path 201a to the digital output of processing path 201b. Thus, for example, analog input signal ANALOG_IN having −30 dBFS of magnitude at 20 Hz may exceed the threshold and thus trigger a switch of selection from the digital output of processing path 201a to the digital output of processing path 201b while analog input signal ANALOG_IN having the same magnitude at 20 KHz may not exceed the threshold.

As mentioned above, when transitioning from selection from the digital output of processing path 201a to the digital output of processing path 201b, state machine 225 may cause adjustable fading coefficient $C_F$ to ramp to its maximum value based on the magnitude of analog input signal ANALOG_IN. Depicted in FIG. 4 are example values of adjustable fading coefficient $C_F$ that may be selected by state machine 225 at particular magnitudes of analog input signal ANALOG_IN when analog input signal ANALOG_IN exceeds frequency-dependent threshold $T_2$. Thus, in the embodiments represented by FIG. 4, if analog input signal ANALOG_IN exceeds frequency-dependent threshold $T_2$ due to greater than −33 dBFs magnitude at 20 Hz, adjustable fading coefficient $C_F$ may be ramped starting at 0.0, and increase by 0.2 for each dB of magnitude increase. However, if analog input signal ANALOG_IN exceeds frequency-dependent threshold $T_2$ due to greater than −31 dBFs magnitude at 100 Hz, adjustable fading coefficient $C_F$ may immediately be increased from 0.0 to 0.4, and then increased by 0.2 for each dB of magnitude increase. It is noted that while fading coefficient $C_F$ may be increased by 0.2 for each dB of magnitude increase, in some embodiments fading coefficient $C_F$ does not necessarily increase in steps of 0.2. For example, in some embodiments, adjustable fading coefficient $C_F$ may have 128 possible values between its minimum and maximum values, and when ramped, may increase by a magnitude of $\frac{1}{128}$ of the different between its minimum and maximum values in a given step.

In addition to reducing audio artifacts in a multi-path analog-to-digital converter as described above, systems and methods similar to those described above may also be employed to reduce audio artifacts in a digital-to-analog converter having selectable gain settings for maximizing dynamic range of the digital-to-analog converter, as described below.

Figure 5:
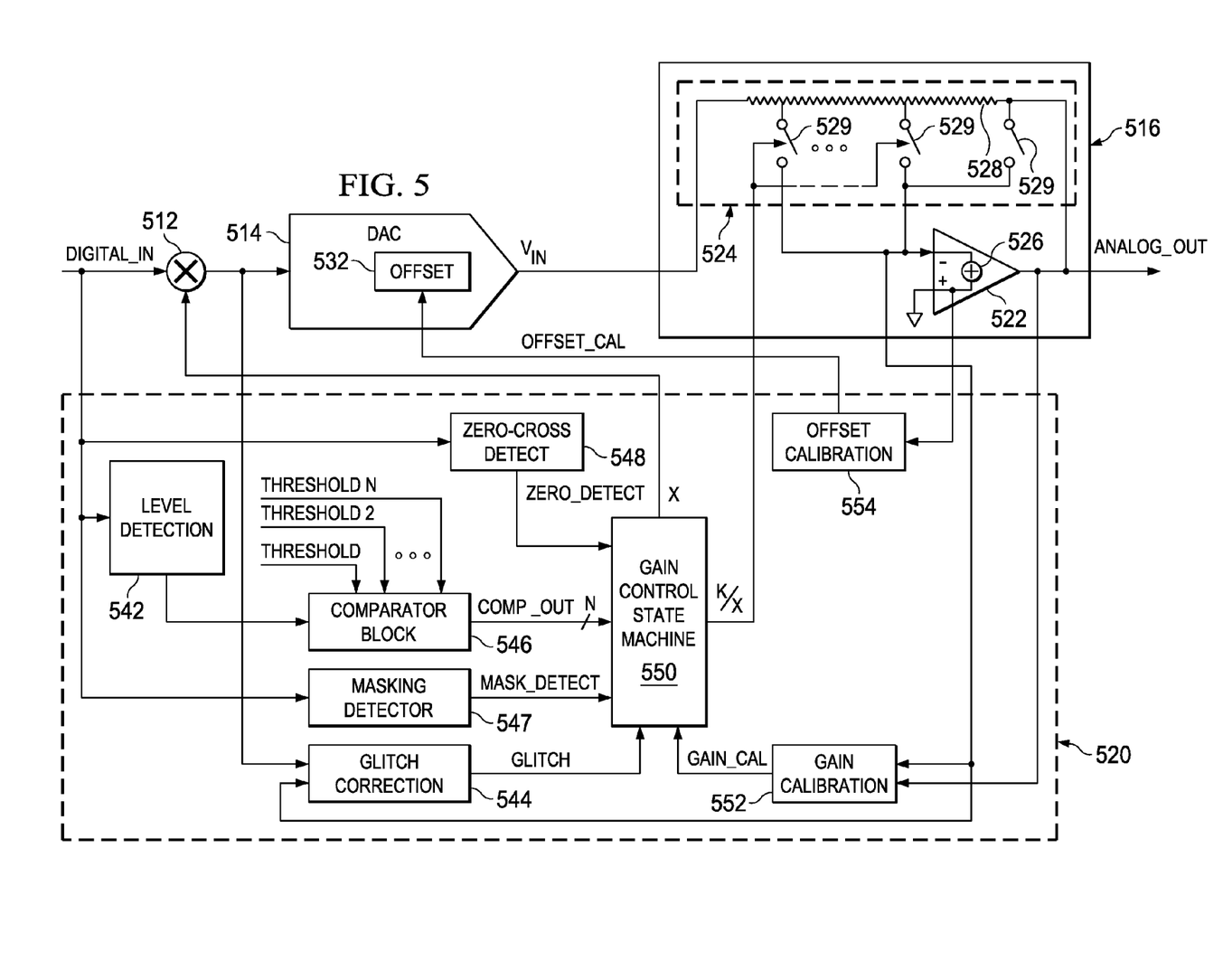
FIG. 5 illustrates a block diagram of selected components of an integrated circuit for processing a digital signal to generate an analog signal, in accordance with embodiments of the present disclosure.

FIG. 5 illustrates a block diagram of selected components of digital-to-analog processor 111, in accordance with embodiments of the present disclosure. As shown in FIG. 5, digital-to-analog processor 111 may receive a digital input signal DIGITAL_IN from digital processor 109. Digital-to-analog processor 111 may include a digital gain element 512 to apply a selectable digital gain x selected by gain control 520 to the digital input signal DIGITAL_IN. The amplified digital audio input signal may be communicated to a digital-to-analog converter (DAC) 514, which may convert the digital audio input signal to an analog signal $V_{IN}$. Together, digital gain element 512 and DAC 514 may be referred to herein as a digital path portion of the signal path from the input node for digital input signal DIGITAL_IN to the output node for output analog signal ANALOG_OUT depicted in FIG. 5. In the relevant art, digital gain element 512 and DAC 514 may sometimes be referred to as an audio compressor.

DAC 514 may supply analog signal $V_{IN}$ to an amplifier stage 516 which may amplify or attenuate audio input signal $V_{IN}$ in conformity with a selectable analog gain k/x to provide an output analog signal ANALOG_OUT, which may operate a speaker, headphone transducer, a line level signal output, and/or other suitable output. Amplifier stage 516 may be referred to herein as an analog path portion of the signal path from the input node for digital input signal DIGITAL_IN to the output node for output analog signal ANALOG_OUT depicted in FIG. 5. In the relevant art, amplifier stage 516 may sometimes be referred to as an audio expander. A power supply (not explicitly shown in FIG. 5) may provide the power supply rail inputs of amplifier stage 516.

As shown in FIG. 5, digital-to-analog processor 111 may include a gain control circuit 520 configured to, based on digital input signal DIGITAL_IN, control selectable digital gain x of gain element 512 and a selectable analog gain k/x of amplifier 516. In embodiments in which a volume control is present, a volume control signal may be provided from a microcontroller or other digital control circuit responsive to a user interface, volume knob encoder or program command, or other suitable mechanism.

As an example of the dynamic range enhancement functionality of digital-to-analog processor 111, when digital input signal DIGITAL_IN is at or near zero decibels (0 dB) relative to the full-scale voltage of digital input signal DIGITAL_IN, gain control circuit 520 may select a first digital gain (e.g., $x_1$) for the selectable digital gain and a first analog gain (e.g., $k/x_1$) for the selectable analog gain. However, if the magnitude of digital input signal DIGITAL_IN is below a particular predetermined threshold magnitude relative to the full-scale voltage of digital input signal DIGITAL_IN (e.g., −20 dB), gain control circuit 520 may select a second digital gain (e.g., $x_2$) greater than the first digital gain (e.g., $x_2 > x_1$) for the selectable digital gain and a second analog gain (e.g., $k/x_2$) lesser than the second analog gain (e.g., $k/x_2 < k/x_1$) for the selectable analog gain. In each case, the cumulative path gain (e.g., k) of the selectable digital gain and the selectable analog gain may be substantially constant (e.g., the same within manufacturing and/or operating tolerances of digital-to-analog processor 111). In some embodiments, k may be approximately equal to 1, such that the cumulative path gain is a unity gain. Such modification of digital gain and analog gain may increase the dynamic range of digital-to-analog processor 111 compared to approaches in which the digital gain and analog gain are static, as it may reduce the noise injected into output analog signal ANALOG_OUT, which noise may be a generally monotonically increasing function of the analog gain of amplifier 516. While such noise may be negligible for higher magnitude audio signals (e.g., at or near 0 dB relative to full-scale voltage), the presence of such noise may become noticeable for lower magnitude audio signals (e.g., at or near −20 dB or lower relative to full-scale voltage). By applying a smaller analog gain at amplifier 516 for smaller signal magnitudes, the amount of noise injected into output analog signal ANALOG_OUT may be reduced, while the signal level of output analog signal ANALOG_OUT may be maintained in accordance with the digital input signal DIGITAL_IN through application of a digital gain to gain element 512 inversely proportional to the analog gain.

Also as shown in FIG. 5, gain control circuit 520 may include a level detection circuit 542, a comparator block 546, a zero-cross detection circuit 548, a glitch correction circuit 544, a gain calibration circuit 552, an offset calibration circuit 554, and a gain control state machine 550. Level detection circuit 542 may include any suitable system, device, or apparatus for receiving digital input signal DIGITAL_IN (or a derivative thereof), determining a magnitude of such signal, and outputting a signal indicative of such magnitude. Comparator block 546 may compare the output signal of level detection circuit 542 with N predetermined threshold magnitudes, wherein N is a positive integer, and based on such comparison, output a signal COMP_OUT (which may comprise N bits) indicative of whether the desired magnitude of output analog signal ANALOG_OUT is greater or lesser than each of such predetermined threshold magnitudes. In some embodiments, such predetermined threshold magnitudes may be relative to a full-scale voltage of digital input signal DIGITAL_IN and/or output analog signal ANALOG_OUT. In some embodiments, comparator block 546 may implement hysteresis, such that signal COMP_OUT or a bit thereof may only transition if the output signal of level detection block 542 remains above or below a predetermined threshold magnitude for a minimum duration of time (e.g., 0.1 seconds to place any switching artifacts outside the human-perceptible audio range).

In these and other embodiments, one or more of the thresholds of comparator block 546 may comprise a frequency-dependent threshold similar to that employed by frequency-dependent level detector 231 of analog-to-digital processor 105. Accordingly, such frequency-dependent threshold may be applied by gain control 520 to determine whether to switch between the selectable gains of digital-to-analog processor 111.

Zero-cross detection circuit 548 may include any suitable system, device, or apparatus for detecting the occurrence of a zero crossing of a digital audio input signal (or a derivative thereof) and outputting a signal ZERO_DETECT indicating that a zero crossing of such signal has occurred. A zero crossing of a signal may occur when the waveform of such signal crosses a magnitude of zero or crosses another level within a threshold of zero and indicative of a zero crossing (e.g., a low signal level of lower than −70 dB or within a small number of least significant bits of zero).

Glitch correction circuit 544 may comprise any suitable system, device, or apparatus for correcting for a latency or group delay between the output of gain element 512 and the input of amplifier stage 516. Such glitch correction may account for a change of the selectable digital gain of gain element 512 which requires a latency to propagate to amplifier stage 516 where a corresponding selectable analog gain may be applied. Without such correction, the latency of group delay may cause audio artifacts to appear at the output of the signal path.

Gain calibration circuit 552 may comprise any suitable system, device, or apparatus for correcting for a non-ideal gain of amplifier stage 516. To illustrate, amplifier stage 516 may comprise an operational amplifier 522 and a switched resistor network 524 comprising a resistor string 528 having a plurality of taps each coupled to a corresponding switch 529. To apply a desired selectable analog gain to amplifier stage 516, switches 529 may be selectively opened and closed to create an effective resistance between a negative input of operational amplifier 522 and the output of operational amplifier 522, wherein the selectable analog gain of operational amplifier 522 is based on such effective resistance. However, due to non-idealities of amplifier stage 516 (e.g., temperature variations, process tolerances, etc.), an actual gain of amplifier stage 516 may differ from that of a desired level of gain determined by gain control state machine 550. Accordingly, gain calibration circuit 552 may determine the actual gain of amplifier stage 516 and output a signal GAIN_CAL indicative of such actual gain, and gain control state machine 550 may correct for non-idealities in selecting the selectable digital gain.

Offset calibration circuit 554 may comprise any suitable system, device, or apparatus for correcting for an offset of amplifier stage 516. To illustrate, operational amplifier 522 may include, due to non-idealities of amplifier stage 516 (e.g., temperature variations, process tolerances, etc.), a slight offset 526 from a desired ground or common mode voltage associated with amplifier stage 516, which may affect signal output $V_{OUT}$. Accordingly, offset calibration circuit 554 may determine the offset 526 of amplifier stage 516 and output a signal OFFSET_CAL, which may be communicated to an offset block 532 of DAC 514 such that DAC 514 may correct for such analog offset.

Masking detector 547 may be similar to masking detector 229 of analog-to-digital processor 105 in that it may detect components of digital input signal DIGITAL_IN that may mask audible artifacts caused by switching between selectable gains of digital-to-analog processor 111.

Gain control state machine 550 may receive signals COMP_OUT, ZERO_DETECT, MASK_DETECT, GLITCH, and/or GAIN_CAL and based on one or more of such signals, generate the selectable digital gain and the selectable analog gain, as described in greater detail elsewhere in this disclosure. For example, when the magnitude of digital input signal DIGITAL_IN transitions from above to below a predetermined threshold magnitude (e.g., −24 dB), signal COMP_OUT may indicate such transition and in response, gain control state machine 550 may wait until the occurrence of a zero crossing (as indicated by signal ZERO_DETECT), after which it may cause DAC 514 to increase the selectable digital gain and decrease the selectable audio gain in a similar amount. By changing the selectable digital gain and the selectable audio gain at a zero crossing of digital audio input signal (or a derivative thereof), the change and any auditory artifacts associated with the change may be masked and therefore be unnoticeable or less noticeable to a listener of an audio device including digital-to-analog processor 111.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A method of ensuring an inaudible change in noise floor when transitioning between signal paths in a multiple-path analog-to-digital converter system, wherein:

the multiple-path analog-to-digital converter system comprises a controller and a plurality of processing paths including a first processing path and a second processing path, wherein:
the first processing path comprises a first analog-to-digital converter, wherein the first processing path is configured to convert an analog signal into a first digital signal; and
the second processing path comprises a second analog-to-digital converter, wherein the second processing path is configured to convert the analog signal into a second digital signal; and
the controller is configured to select one of the first digital signal and the second digital signal as a digital output signal of the processing system based on a magnitude of the analog signal and, when changing selection between the first digital signal and the second digital signal as the digital output signal, transition between the first digital signal and the second digital signal such that during the transition, the digital output signal is a weighted average of the first digital signal and the second digital signal wherein a weight of the first digital signal relative to a weight of the second digital signal increases or decreases during the transition; and the method comprises:
detecting a condition for auditory masking of the change in the noise floor; and
transitioning between signal paths of the multiple-path analog-to-digital converter system in response to detecting the condition.

2. The method of claim 1, wherein detecting the condition comprises determining whether a magnitude of an input signal to the multiple-path analog-to-digital converter system is above a predetermined threshold magnitude.

3. The method of claim 1, wherein detecting the condition comprises:
filtering an input signal to the multiple-path analog-to-digital converter system based on spectral content of the input signal to generate a frequency-filtered input signal; and
determining whether a magnitude of the frequency-filtered input signal is above a predetermined threshold magnitude.

4. The method of claim 3, wherein filtering the input signal comprises filtering with a filter that models relative loudness perceived by a human ear as a function of frequency of sound incident on the human ear.

5. The method of claim 4, wherein the filter comprises one of an A-weighting filter and an ISO 226 filter.

6. The method of claim 1, wherein the signal paths comprise a first processing path for processing audio signals of lower magnitudes and a second processing path for processing audio signals of higher magnitudes, the method further comprising:
generating an adjustable fading coefficient defining the relative levels by which the respective outputs of the first processing path and the second processing path contribute to an overall output signal generated by the multiple-path analog-to-digital converter system during a transition between selection of the first processing path and the second processing path; and
setting a minimum fading level of the fading coefficient to an intermediate fading level between that at which the first processing path contributes entirely to the overall output signal and that at which the second processing path contributes entirely to the overall output signal.

7. The method of claim 1, wherein:
the condition for auditory masking of the change in the noise floor is a frequency-dependent threshold for switching between signal paths of the multiple-path analog-to-digital converter system; and
transitioning between signal paths of the multiple-path analog-to-digital converter system comprises switching between signal paths of the multiple-path analog-to-digital converter system in response to the audio signal having a magnitude at a frequency of the audio signal increasing above the frequency-dependent threshold at the frequency.

8. A processing system comprising:
a plurality of processing paths including a first processing path and a second processing path, wherein:
the first processing path comprises a first analog-to-digital converter, wherein the first processing path is configured to convert an analog signal into a first digital signal; and
the second processing path comprises a second analog-to-digital converter, wherein the second processing path is configured to convert the analog signal into a second digital signal; and
a controller configured to:
select one of the first digital signal and the second digital signal as a digital output signal of the processing system based on a magnitude of the analog signal;
when changing selection between the first digital signal and the second digital signal as the digital output signal, transition between the first digital signal and the second digital signal such that during the transition, the digital output signal is a weighted average of the first digital signal and the second digital signal wherein a weight of the first digital signal relative to a weight of the second digital signal increases or decreases during the transition;
ensure an inaudible change in noise floor when transitioning between the first processing path and the second processing path by:
detecting a condition for auditory masking of the change in the noise floor; and
transitioning between the first processing path and the second processing path in response to detecting the condition.

9. The processing system of claim 8, wherein detecting the condition comprises determining whether a magnitude of the analog signal is above a predetermined threshold magnitude.

10. The processing system of claim 8, wherein the controller implements a filter and detecting the condition comprises:
filtering the input signal with the filter based on spectral content of the input signal to generate a frequency-filtered input signal; and
determining whether a magnitude of the frequency-filtered input signal is above a predetermined threshold magnitude.

11. The processing system of claim 10, wherein the filter models relative loudness perceived by a human ear as a function of frequency of sound incident on the human ear.

12. The processing system of claim 11, wherein the filter comprises one of an A-weighting filter and an ISO 226 filter.

13. The processing system of claim 8, wherein the controller is further configured to:
generate an adjustable fading coefficient defining the relative levels by which the respective outputs of the first processing path and the second processing path contribute to an overall output signal generated by the multiple-path analog-to-digital converter system during a transition between selection of the first processing path and the second processing path; and set a minimum fading level of the fading coefficient to an intermediate fading level between that at which the first processing path contributes entirely to the overall output signal and that at which the second processing path contributes entirely to the overall output signal.

14. The processing system of claim 8, wherein:

the condition for auditory masking of the change in the noise floor is a frequency-dependent threshold for switching between signal paths of the multiple-path analog-to-digital converter system; and transitioning between signal paths of the multiple-path analog-to-digital converter system comprises switching between signal paths of the multiple-path analog-to-digital converter system in response to the audio signal having a magnitude at a frequency of the audio signal increasing above the frequency-dependent threshold at the frequency.

15. A method of processing an audio signal in a multiple-path analog-to-digital converter system to achieve higher performance for a longer duration for certain frequencies of the audio signal when an error for certain frequencies is lesser than a corresponding error for other frequencies, comprising:

providing a frequency-dependent threshold for switching between signal paths of the multiple-path analog-to-digital converter system;

switching between signal paths of the multiple-path analog-to-digital converter system in response to the audio signal having a magnitude at a frequency of the audio signal increasing above the frequency-dependent threshold at the frequency; wherein the multiple-path analog-to-digital converter system comprises a first processing path for processing audio signals of lower magnitudes and a second processing path for processing audio signals of higher magnitudes;

determining whether a magnitude of the audio signal exceeds a second threshold indicative of a likelihood of audio distortion due to signal clipping if the audio signal is processed by the first processing path; and selecting the second processing path if the audio signal exceeds the second threshold, regardless of whether or not the audio signal has a magnitude at any frequency of the audio signal increasing above the frequency-dependent threshold.

16. A processing system comprising:

a plurality of processing paths including a first processing path and a second processing path, wherein:

the first processing path comprises a first analog-to-digital converter, wherein the first processing path is configured to convert an analog signal into a first digital signal;

the second processing path comprises a second analog-to-digital converter, wherein the second processing path is configured to convert the analog signal into a second digital signal; and wherein the first processing path is for processing audio signals of lower magnitudes and the second processing path is for processing audio signals of higher magnitudes; and a controller configured to:

switch between the first digital signal and the second digital signal in response to the analog signal having a magnitude at a frequency of the analog signal increasing above a frequency-dependent threshold at the frequency;

determine whether a magnitude of the analog signal exceeds a second threshold indicative of a likelihood of audio distortion due to signal clipping if the analog signal is processed by the first processing path; and select the second processing path if the analog signal exceeds the second threshold, regardless of whether or not the analog signal has a magnitude at any frequency of the analog signal increasing above the frequency-dependent threshold.

17. A method for configuring a noise floor level for a multiple-path analog-to-digital converter system having at least a first processing path for processing audio signals of lower magnitudes and a second processing path for processing audio signals of higher magnitudes, the method comprising:

generating an adjustable fading coefficient defining the relative levels by which the respective outputs of the first processing path and the second processing path contribute to an overall output signal generated by the multiple-path analog-to-digital converter system during a transition between selection of the first processing path and the second processing path; and setting a minimum fading level of the fading coefficient to an intermediate fading level between that at which the first processing path contributes entirely to the overall output signal and that at which the second processing path contributes entirely to the overall output signal.

18. The method of claim 17, further comprising:

detecting a condition in which a transition between selection of the first processing path and the second processing path is likely to cause an audibly-detectable change in the noise floor level; and setting the minimum fading level in response to detecting the condition.

19. The method of claim 18, wherein the condition is a total gain of a signal path of the multiple-path analog-to-digital converter system likely to cause an audibly-detectable change in the noise floor level.

20. A processing system comprising:

a plurality of processing paths including a first processing path for processing audio signals of lower magnitudes and a second processing path for processing audio signals of higher magnitudes, wherein:

the first processing path comprises a first analog-to-digital converter, wherein the first processing path is configured to convert an analog signal into a first digital signal; and the second processing path comprises a second analog-to-digital converter, wherein the second processing path is configured to convert the analog signal into a second digital signal; and a controller configured to:

generate an adjustable fading coefficient defining the relative levels by which the respective outputs of the first processing path and the second processing path contribute to an overall digital output signal generated by a multiple-path analog-to-digital converter system during a transition between selection of the first processing path and the second processing path; and set a minimum fading level of the fading coefficient to an intermediate fading level between that at which the first processing path contributes entirely to the overall digital output signal and that at which the second processing path contributes entirely to the overall digital output signal.

21. The processing system of claim 20, wherein the controller is further configured to:
  detect a condition in which a transition between selection of the first processing path and the second processing path is likely to cause an audibly-detectable change in a noise floor level of the multiple-path analog-to-digital converter system; and
  set the minimum fading level in response to detecting the condition.

22. The processing system of claim 20, wherein the condition is a total gain of a signal path of the multiple-path analog-to-digital converter system likely to cause an audibly-detectable change in a noise floor level of the multiple-path analog-to-digital converter system.

* * * * *